(12) United States Patent
Demma

(10) Patent No.: US 8,882,317 B2
(45) Date of Patent: *Nov. 11, 2014

(54) DISPLAY SWITCH UNIT FOR A VEHICLE AND METHOD FOR PRODUCING THE DISPLAY SWITCH UNIT

(75) Inventor: Dino Demma, Ruesselsheim (DE)

(73) Assignee: GM Global Technology Operations LLC, Detroit, MI (US)

( * ) Notice: Subject to any disclaimer, the term of this patent is extended or adjusted under 35 U.S.C. 154(b) by 145 days.

This patent is subject to a terminal disclaimer.

(21) Appl. No.: 13/441,388

(22) Filed: Apr. 6, 2012

(65) Prior Publication Data

US 2012/0255846 A1    Oct. 11, 2012

(30) Foreign Application Priority Data

Apr. 8, 2011  (DE) .......................... 10 2011 016 438

(51) Int. Cl.
*F21V 9/00* (2006.01)
*H03K 17/96* (2006.01)

(52) U.S. Cl.
CPC .. *H03K 17/962* (2013.01); *H03K 2217/960785* (2013.01); *H03K 2217/96078* (2013.01); *H03K 2017/9602* (2013.01)
USPC ............ 362/511; 362/487; 362/488; 362/489

(58) Field of Classification Search
USPC ................................................ 362/459–549
See application file for complete search history.

(56) References Cited

U.S. PATENT DOCUMENTS

| | | |
|---|---|---|
| 5,239,152 A | 8/1993 | Caldwell et al. |
| 7,168,268 B2 | 1/2007 | Czarnetzki |
| 7,793,448 B1 | 9/2010 | Huang et al. |
| 7,868,778 B2 | 1/2011 | Kenwright |
| 8,099,209 B2 | 1/2012 | Tschirhart |
| 2003/0210537 A1 | 11/2003 | Engelmann |
| 2006/0042071 A1 | 3/2006 | Kaneko |
| 2008/0122661 A1 | 5/2008 | Han |
| 2010/0066254 A1 | 3/2010 | Ott et al. |
| 2010/0179725 A1 | 7/2010 | Boote et al. |
| 2010/0219935 A1 | 9/2010 | Bingle et al. |
| 2012/0257416 A1* | 10/2012 | Demma ........................ 362/613 |

FOREIGN PATENT DOCUMENTS

| | | |
|---|---|---|
| DE | 9403322 U1 | 9/1994 |
| DE | 10107975 A1 | 10/2002 |
| DE | 10118876 A1 | 10/2002 |

(Continued)

OTHER PUBLICATIONS

German Patent Office, German Search Report dated Feb. 3, 2012 for German Application No. 102011016438.3.

*Primary Examiner* — William Carter
(74) *Attorney, Agent, or Firm* — Ingrassia Fisher & Lorenz, P.C.

(57) ABSTRACT

A display switch unit is provided for a vehicle and a method for producing the display switch unit. The display switch unit has at least one transparent front plastic region and a rear plastic region. Plastic switch symbols are disposed in the transparent front plastic region of the plastic body. Sensor structures of proximity sensors are each disposed behind one of the plastic switch symbols in the rear plastic region. The material of the plastic switch symbols includes, but is not limited to light-sensitive invisible particles, which are disposed in such a manner that under irradiation, colored illuminated switch symbols are visible in the surrounding transparent front plastic region.

19 Claims, 9 Drawing Sheets

(56) References Cited

FOREIGN PATENT DOCUMENTS

| | | |
|---|---|---|
| DE | 102006017067 A1 | 10/2007 |
| DE | 102006061164 A1 | 6/2008 |
| DE | 102008004995 B3 | 12/2008 |
| DE | 102009026902 A1 | 1/2010 |
| EP | 1767986 A1 | 3/2007 |
| EP | 1926213 A2 | 5/2008 |
| EP | 2208645 A1 | 7/2010 |
| WO | 2007035115 A1 | 3/2007 |
| WO | 2009089092 A1 | 7/2009 |

\* cited by examiner

DISPLAY SWITCH UNIT FOR A VEHICLE AND METHOD FOR PRODUCING THE DISPLAY SWITCH UNIT

CROSS-REFERENCE TO RELATED APPLICATION

This application claims priority to German Patent Application No. DE 10 2011 016 438.3, filed Apr. 8, 2011, which is incorporated herein by reference in its entirety.

TECHNICAL FIELD

The technical field generally relates to a display switch unit for a vehicle and a method for producing the display switch unit, and more particularly relates to a display switch unit that comprises at least one transparent front plastic region and a rear plastic region, with plastic switch symbols are provided in the transparent front plastic region of the plastic body.

BACKGROUND

Known from the document DE 101 18 876 A1 is a method for producing colored structures on a material, in particular for inscribing the material by local heating of volume elements of the material with a laser beam. To this end, metal ions in the form of submicroscopic particles are used for coloring the material. For introducing the metal ions into the undoped material, a solution or a gel of a metal salt is applied to a surface of the material and the local heating is produced by the laser beam, which thereby introduces the colored structure by local heating on the surface for inscribing the material.

However, this method only delivers flat symbols for a display device. In addition, with this laser method the symbols are only blackened in plastic materials and do not allow any colored design. Particularly for vehicles, the design options for display devices are restricted to different-colored backlights although there is a need on the part of the manufacturers to differentiate their vehicles and provide unique style and design types particularly with reference to look and feel. Since the available possibilities for display have been limited for years, the scope for style and design for differentiating and characterizing vehicles is extremely restricted in this area.

Therefore, it is at least one object to overcome these limits and provide a display switch unit for a vehicle and a method for producing the display switch unit, which extends the possibilities of style and design type for such vehicles and improves the operating comfort in a vehicle. In addition, other objects, desirable features and characteristics will become apparent from the subsequent summary and detailed description, and the appended claims, taken in conjunction with the accompanying drawings and this background.

SUMMARY

A display switch unit is provided for a vehicle and a method for producing the display switch unit. In one embodiment, the display switch unit has at least one transparent front plastic region and a rear plastic region. Plastic switch symbols are disposed in the transparent front plastic region of the plastic body. Sensor structures of proximity sensors are each disposed behind one of the plastic switch symbols in the rear plastic region. The material of the plastic switch symbols comprises light-sensitive invisible particles, which are disposed in such a manner that under irradiation, colored illuminated switch symbols are visible in the surrounding transparent front plastic region.

Compared with the conventional switch levers, slide switches, toggle switches, rotary knobs, and other possibilities for actuation disposed at or on the steering wheel, this display switch unit has the advantage that with such a display switch unit the driver can concentrate completely on the road traffic and steering his vehicle, and in order to trigger various functions such as switch on lights, low beams, high beam, air conditioning adjustments, seat heaters, windshield heaters, and other functions, the driver can bring about the appropriate functions during travel by simply bring an operating finger of his hand toward the display switch unit without actuating levers or other mechanical aids.

At least driving comfort is improved by the provision of such a display switch unit, especially as no movements opposite to the steering wheel movements are required as is required, for example, in the case of switch levers for actuating windshield wipers, windshield washers, or similar. At the same time, an attractive and clear colored switching surface can be provided by the illuminatable switch symbols of the display switch unit, which at least improves the stylistic and creative possibilities in relation to the interior fittings of a vehicle.

In a further embodiment, the sensor structures furthermore comprise invisible electrically conducting layer structures, which are applied to a rear side of the transparent front plastic region behind the switch symbols so that they are invisible and thus do not adversely affect the display of the switch symbols. In order to connect the layer structures of the sensor structures electrically to a circuit, electrical plug connections are provided on the edge sides of the plastic body having a plurality of regions, so that the display switch unit can be mounted inexpensively and the electrical connections do not impair the view of the switch symbols.

It is further provided that the sensor structures with their electrically conducting invisible flat layer structures comprise capacitor structures. In this case, the electrically conducting layer structures form capacitively coupled antenna structures of an oscillator circuit connected to the edge-side electrical connections, whose capacitive coupling is changed by the approach of an operating finger and a switching pulse is thereby triggered. At the same time, it is provided that the capacitive coupling enables a directional identification so that operating functions for driver and passenger can be distinguished. Changes, for example, of the seat heating, ventilation, temperature, and air conditioning settings can thus be adapted individually for the driver and the passenger side.

It is further provided to provide one or more circuit boards with the electronics for the sensor structure as an opaque additional layer on the rear side of the transparent plastic body. In addition, the display switch unit can have a backlight adapted to day and night operation. In night operation the backlight is lowered in its intensity compared with daytime operation in order to minimize disturbing reflections in the surrounding wind shield surfaces inside a vehicle and avoid a glare effect for the driver.

It is further provided that each switch symbol has different switch position display colors. For example, the switch symbols can light up in different colors. For example, three different-colored switch positions can be signaled such as function ready, function switched-on, and function switched-off. For example, the function ready can be displayed by the plastic switch symbol lighting up yellow while a non-lighting-up unilluminated switch symbol comprising a transparent switch symbol interspersed with light-sensitive particles can indicate that the function is not ready. A red switch position display color, for example, of the surrounding transparent undoped plastic can symbolize a switch-off function and a green switch position display color can identify the switched-on function of the switch symbol. While the readiness of the switch symbol can be shown by the lighting-up or non-lighting-up of the light-sensitive particles in the plastic of the switch symbol, the switch position display colors can be achieved by the different illumination of the transparent plastic compound surrounding the switch symbols.

In order to provide these different display colors for the switch positions, it is provided that in addition to a backlight, light-emitting diodes having different light colors are disposed on edge sides of the plastic body and are each aligned onto the region of one of the switch symbols. It is thereby ensured that each switch symbol for itself and its surrounding plastic compound can light up in the different switch position display colors.

It is further provided that the switch symbols are arranged three-dimensionally in the plastic volume of the transparent front plastic region. To this end, the three-dimensionally shaped switch symbols are made from the aforementioned plastic compound having light-sensitive invisible particles and embedded in a transparent undoped plastic compound of the front region. It is also possible to selectively introduce the light-sensitive particles specifically and in a localized manner to the switch symbol into a plastic compound. It is also possible to incorporate three-dimensional recesses in the transparent plastic compound of the front plastic region, which are then filled with the plastic compound having light-sensitive invisible particles to form three-dimensional switch symbols or glued into the pre-fabricated three-dimensional switch symbols by means of a transparent adhesive.

In a further embodiment, the plastic compound of the colored illuminating switch symbols comprises light-sensitive particles, which can be excited by a backlight to light up in color in order to thus indicate the switching readiness of the individual symbols or the entire display switch unit. In this case, it is not necessary for the light source of the backlight to be disposed on the rear side of the rear plastic region of the plastic body. On the contrary, the plastic body can illuminated from its edge sides. It is also possible to provide reflector particles in the rear plastic region in order to deflect or reflect a laterally disposed backlight toward the front side of the plastic body.

The sensor structure can either be a structure made of extremely thin wire having a diameter less than that of a human hair so that it is barely identifiable in the plastic body of the display switch unit or a strip structure or meander structure made of a transparent electrically conducting structured indium oxide or structured iron oxide coating. In this case, the sensor structure is electrically conducting and its electric capacity can be triggered by bringing a fingertip toward the switch symbols and thereby, for example, changing the natural oscillation of an oscillating circuit of an electronic circuit in such a manner that a switch signal can be derived therefrom, by which means a function represented by the switch signal can be switched on or off.

A method for producing a display switch unit for a vehicle comprises the following process steps. Firstly, dimensionally stable three-dimensional transparent plastic switch symbols are produced from a plastic compound that can be excited to light up. This dimensionally stable three-dimensional plastic switch symbol can then be embedded in a transparent front plastic region made of a transparent plastic compound. An electrically conducting transparent coating is then applied to a rear side of the transparent front plastic region. Now the coating is structured to form a sensor structure of a proximity sensor. A rear plastic region congruent to the front transparent plastic region is finally applied.

With this method, it is possible to make switch symbols, which are initially not visible in a plastic body, light up in color in this display switch unit whereby light from the edges of the display switch unit is incident on non-visible light-sensitive particles and makes these light up in color. To this end, plastic symbols made of a plastic such as Plexiglas that contains these light-sensitive particles are selected for such a three-dimensional switch symbol and embedded in a transparent plastic mass of the front transparent plastic region.

In order to also integrate a switch function in such a plastic body, it is provided to apply an electrically conducting non-visible coating or an almost non-visible wire to the rear side of the transparent front plastic region and then cover the rear transparent plastic region with a rear plastic region for protection of such an electrically conducting structure. In this case, both plastic regions can be fused together to form a complete plastic body at their joining faces. The three-dimensional plastic switch symbols can also be embedded by means of potting the three-dimensional plastic switch symbols into a transparent plastic compound under vacuum in order to ensure that no bubble formations disturb the transition between the plastics.

The embedding of the three-dimensional plastic switch symbols can also be accomplished by gluing the switch symbols in prepared recesses of the front transparent plastic region. To this end, the switch symbols can be glued into the recesses with the aid of a transparent adhesive so that here also the transition from the transparent plastic region to the switch symbols is not identifiable as long as the display switch unit is not flooded by light.

In order to apply a translucent electrically conducting coating for a proximity sensor, a spraying, vapor deposition, PVD (physical vapor deposition) or CDV (chemical vapor deposition) method can be carried out with a subsequent selective etching to form a sensor structure. Such a selective etching is usually achieved whereby the components not to be etched are covered before the actual etching process with a structured photovarnish layer. In this case, the etching agent or the etching solution is determined by the properties of the electrically conducting but translucent coating, which, as already mentioned, can be indium oxide or iron oxide. A structuring of such sensor structures of an electrically conducting coating can also be accomplished by means of laser processes.

Furthermore it is possible that a visual or an audible or a haptic signal is triggered when switching one of the switch symbols, whereby the driver of the vehicle is additionally informed about the respective switching state of the switch of the display switch unit. Instead of potting the rear plastic region on the front plastic region, it can also be provided that the rear plastic region is prefabricated and then glued with a transparent plastic onto the rear side of the front transparent plastic region.

In addition, other objects, desirable features and characteristics will become apparent from the subsequent summary and detailed description, and the appended claims, taken in conjunction with the accompanying drawings and this background.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit application and uses. Furthermore, there is no intention to be bound by any theory presented in the preceding background or summary or the following detailed description.

Figure 1:
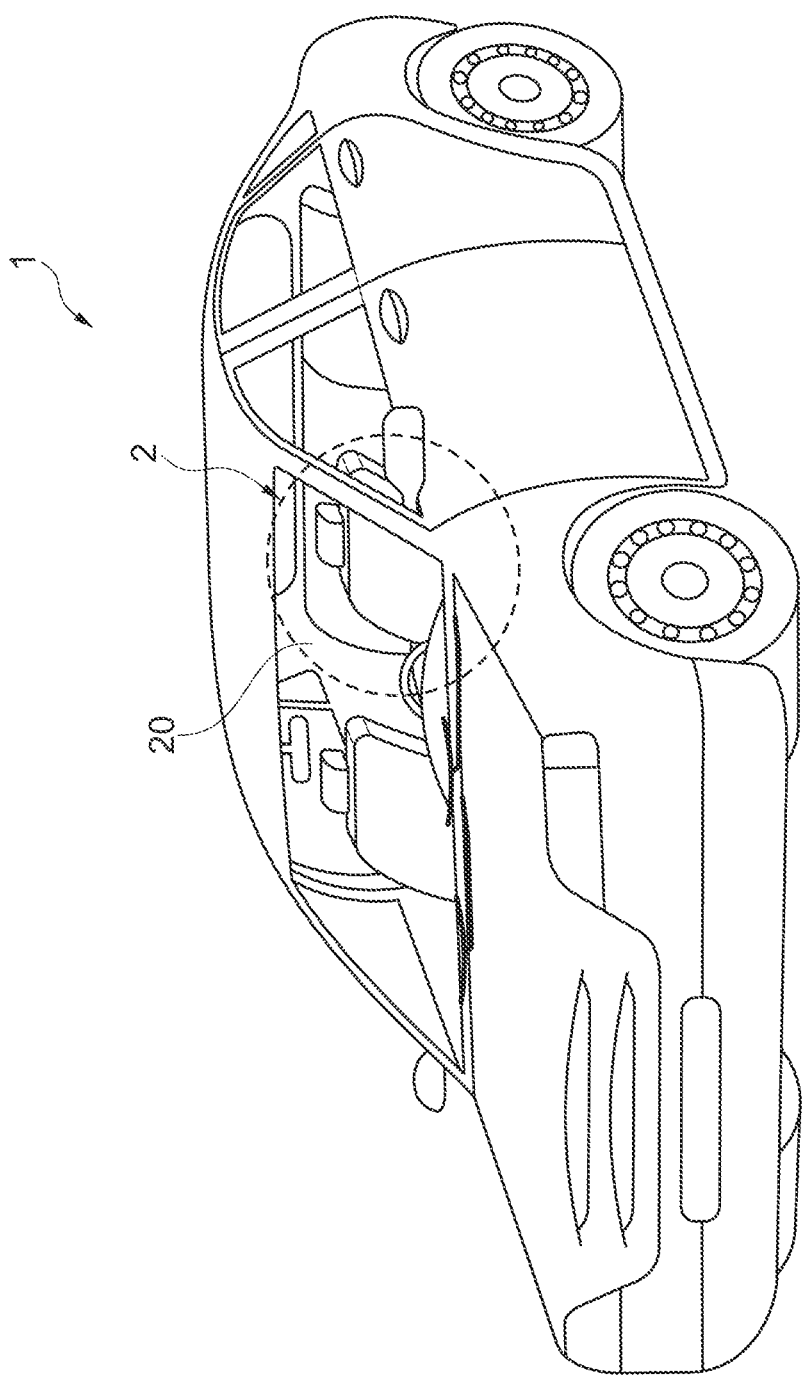
FIG. 1 shows a schematic view of a vehicle having a display switch unit in a vehicle driver area.

FIG. 1 shows a schematic view of a vehicle 1 having a display switch unit in a vehicle driver area 2, which is marked by a circle. Located in the vehicle driver area 2 are components and functions of the vehicle 1 in the interior 20 which are disposed in the operating range of the vehicle driver. This includes the new display switch unit as is explained in detail in the following figures.

Figure 2:
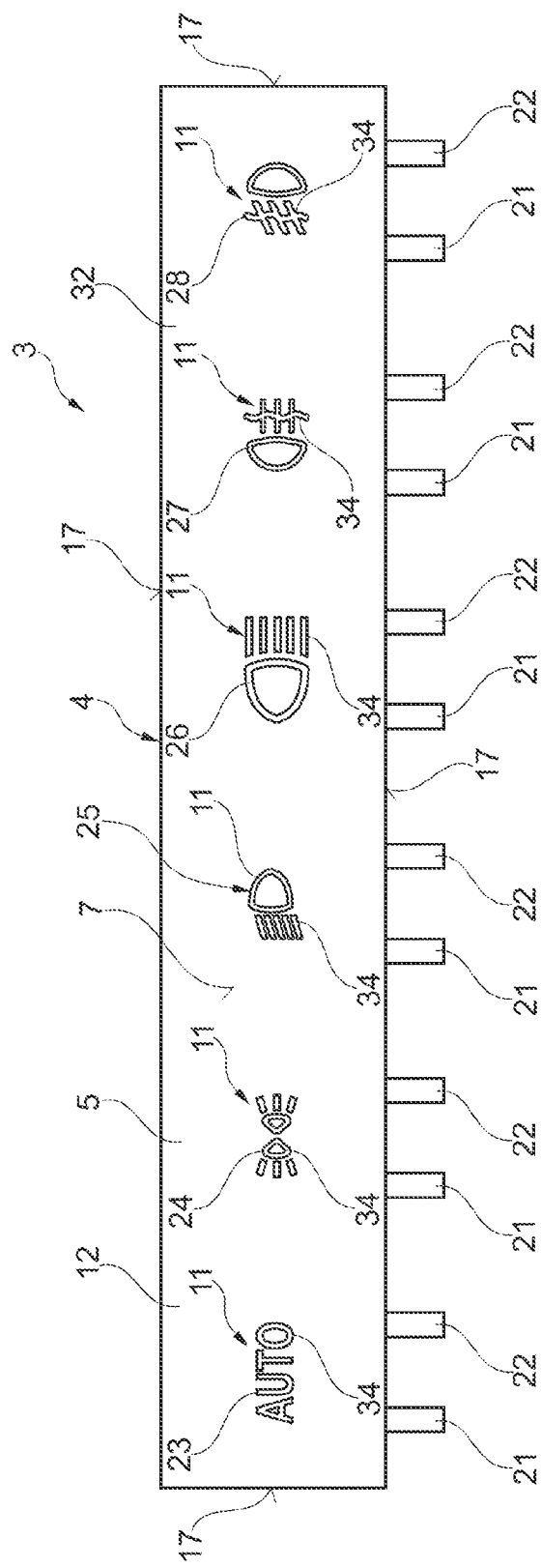
FIG. 2 shows a schematic front view of a display switch unit.

FIG. 2 shows a schematic front view of a display switch unit 3. The display switch unit 3 comprises a plastic body 4, of which a front plastic region 5 can be seen here in the front view, in which switch symbols 11 are disposed, which represent a small selection of possible switch symbols which can be actuated with the aid of such a display switch unit 3. For example, six switch symbols 23 to 28 are shown, where symbol 23 is an alphanumeric switch symbol and 24 is a switch symbol of a vehicle marker light, that is disposed in the front plastic region 5 of the plastic body 4. In addition, a switch symbol for low beam is shown by the plastic switch symbol 25 and a high beam is shown by the plastic switch symbol 26. Finally, the plastic switch symbol 27 is also provided on this display switch unit 3, which is provided for switching on the rear fog-lamp and the plastic switch symbol 28 that is provided for a fog light.

In addition, this front view shows that on a lower edge side 17 of the plastic body 4, two light-emitting diodes 21 and 22 are provided for each of the plastic switch symbols 23 to 28, which are provided in addition to a backlight and by which means the plastic switch symbols 23 to 28 themselves are excited to light up in order to additionally add two different colors for the transparent plastic compound 32 surrounding the switch symbol 23 to 24 and in order to thereby signal the switching state of the respective switch symbol 23 to 28. Thus, for example, a green light-emitting diode 21 is provided for the switched-on state of a vehicle function and a red light-emitting diode 22 is provided for the switched-off state. The light-emitting diodes 21 and 22 couple their colored light via the lower edge side 17 in the rear plastic region of the plastic body 4 so that a front transparent plastic volume 12 surrounding the respective plastic switch symbols 23 to 28 is indirectly illuminated.

Figure 3:
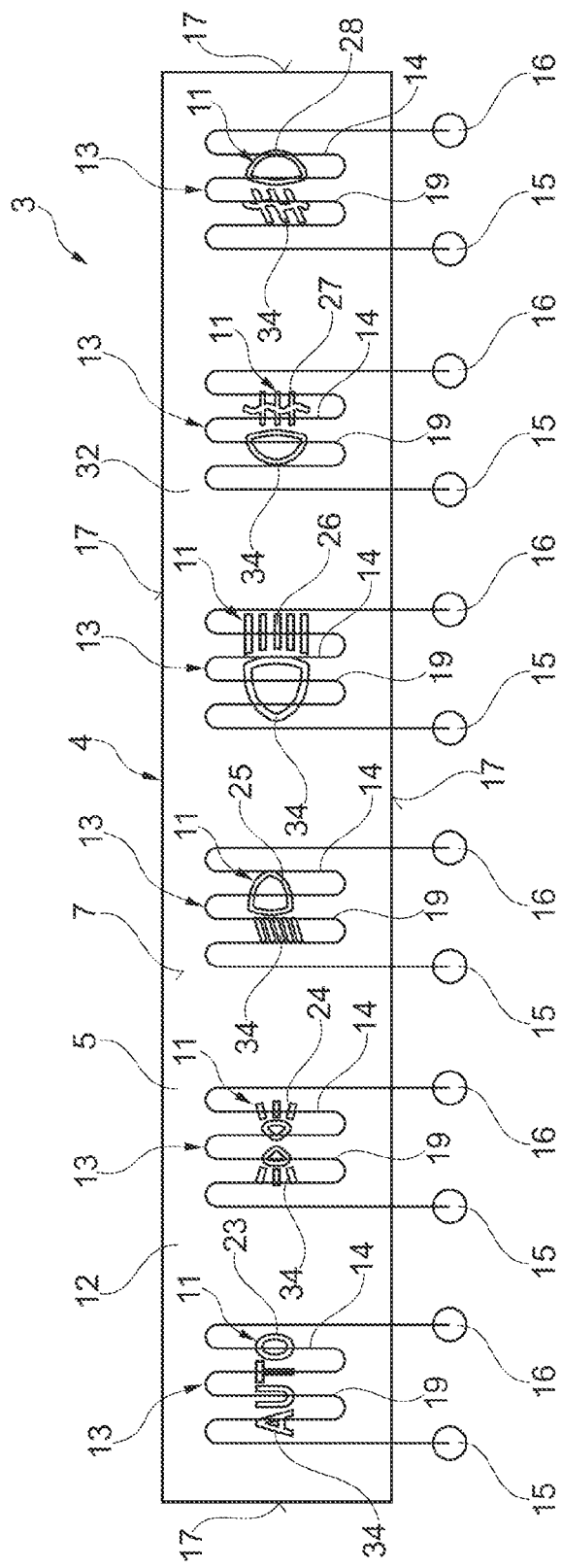
FIG. 3 shows a schematic front view of the display switch unit according to FIG. 2 with proximity sensors of a first embodiment.

FIG. 3 shows a schematic front view of the display switch unit 3 with proximity sensors 13 of a first embodiment. The proximity sensors 13 are here designed as meander-shaped and provided as capacitance electrodes, where the capacitance changes at the instant at which an operating finger of the driver approaches the switch symbol and therefore the meander structure 18. The proximity sensors 13 with their sensor structures 14, which are here formed in meander shape as meander structures 19, can adjust the capacitance, for example, of an oscillatory circuit as an operating finger of the driver approaches, in such a manner that the oscillatory circuit triggers a switching process. To this end, the meander structure 19 goes over into electrical connections 15 and 16 provided for each of these sensor structures 14.

Figure 4:
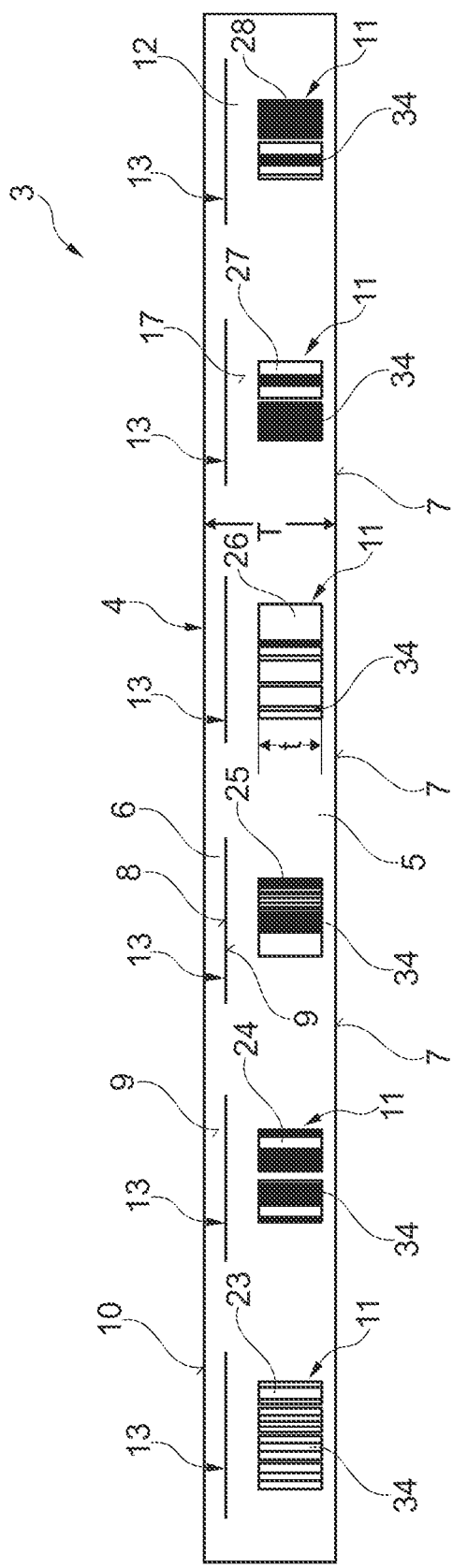
FIG. 4 shows a schematic plan view of a plastic body of the display switch unit according to FIG. 2.

FIG. 4 shows a schematic plan view of the plastic body 4 having a plurality of regions, where only two regions can be seen here, i.e. a front plastic region 5 with a front side 7 and a rear region 6 with a rear side 10 of the plastic body 4. The plastic body 4 has a depth T, where three-dimensional plastic switch symbols 23 to 28 are disposed in the front region, having a depth t which is less than the depth T of the plastic body 4. On the rear side 9 of the front plastic region, the meander structure 19 shown in FIG. 3 can be vapor-deposited or it is provided on a front side 8 of a rear plastic region 6. As a result of the thin conductive coating, in this plan view only a thin separating line can be seen at the positions of the proximity sensors, at which the structured conductive coating of the respective sensor structure is provided. The rear plastic region 6 is potted with its front side 8 on the rear side 9 of the front plastic region 5. In addition, it is also possible that the front plastic region 5 and the rear plastic region 6 are produced separately as sub-regions of the plastic body 4 and then, after applying the interposed sensor structure, glued onto one another with a transparent adhesive.

Figure 5:
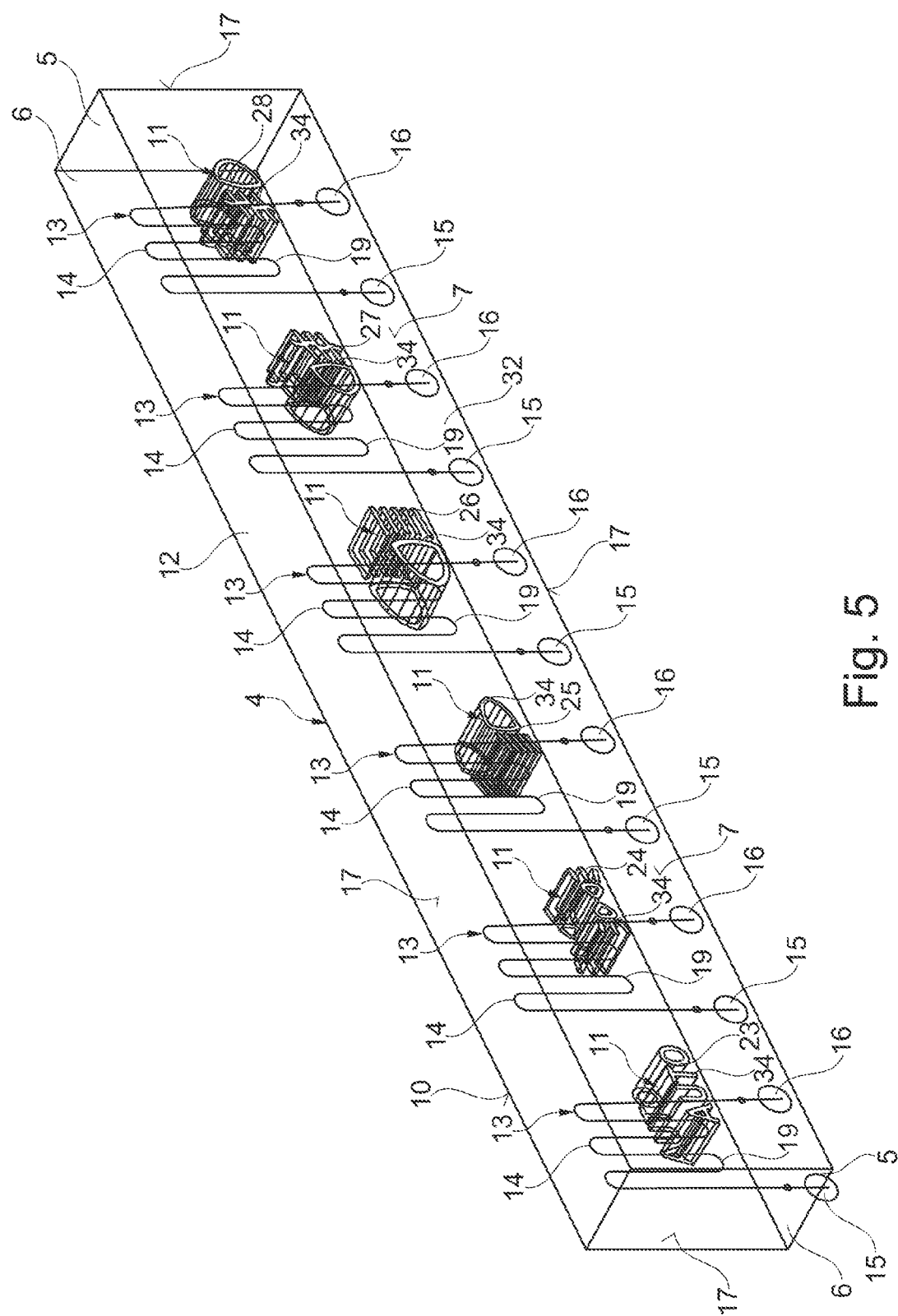
FIG. 5 shows a schematic perspective view of a plastic body of the display switch unit according to FIG. 3.

FIG. 5 shows a schematic perspective view of a plastic body 4 of the display switch unit 3. However, neither the backlight source nor the positions of the colored light-emitting diodes are indicated, which illuminate the three-dimensional plastic switch symbols 11 disposed in the front plastic region 5 or the surrounding plastic. Depending on the operating state, the readiness of the display switch unit 3 can be indicated by switching on or off the backlight source. When the backlight is switched on, light is coupled into the plastic volume 12 from the edge sides or from the rear side of the plastic body 4, where light-sensitive particles of the plastic compound 34 of the plastic switch symbols 11 light up in color. As has already been mentioned above, the surrounding transparent plastic mass can be illuminated in color by corresponding light-emitting diodes in such a manner that the switching state of the individual plastic switch symbols 11 is indicated.

In addition, FIG. 5 shows the sensor structure 14 of the proximity sensors 13, which are either applied as a thin wire structure or as transparent electrically conducting strips in meander form to the rear side 9 of the front plastic region 5. If the front plastic region 5 and the rear plastic region 6 are prepared as separate plastic parts, they can be interconnected thanks to a plastic joint 41 of a transparent adhesive shown only in part here. From the lower edge side 17 of the plastic body 4, the connections 15 and 16 to the sensor structures project in the area of the sensor structures 14. These electrical connections 15 and 16 can be designed as plugs or as sockets and form contact surfaces on the lower edge side 17, via which the sensor structures 14 are connected to corresponding sensor circuits.

Figure 6:
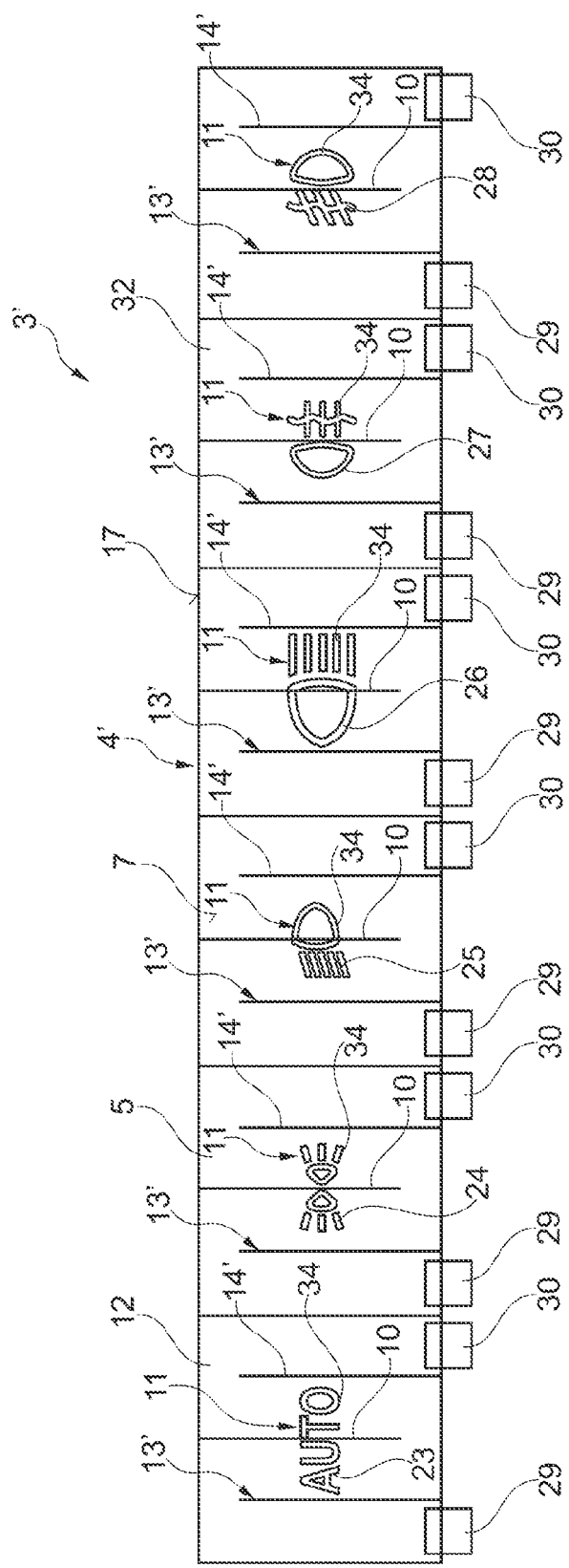
FIG. 6 shows a schematic front view of a display switch unit with proximity sensors of another embodiment.

FIG. 6 shows a schematic front view of a display switch unit 3' with proximity sensors 13' of another embodiment. Components having the same functions as in the preceding figures are identified with the same reference numbers and not explained additionally. The sensor structure 14' symbolized by lines can either comprise thin wires embedded between the rear and the front plastic region or they can be configured as transparent electrically conducting strips, which are structured on the rear side 9 of the front plastic region 5. For each sensor structure 14' this electrically conducting sensor structure 14' goes over into electrical connections 29 and 30 on the lower edge side 17 of the rear plastic region 6. These electrical connections 29 and 30 can comprise plug contacts or plug sockets, or surface-mountable contact surfaces.

An electrically conducting transparent coating can, for example, comprise indium oxide or iron oxide. The structuring to form a sensor structure 14' with straight vertical adjacent strips can be achieved by a selective etching method. If an operating finger of the driver approaches one of the plastic switch symbols and the display switch unit 3' is in readiness, the strip structure 18 of the proximity sensors 13' will experience a change in capacitance which can be used to electrically trigger a switching process in order to execute the functions associated with the plastic switch symbols when driving the vehicle.

Figure 7:
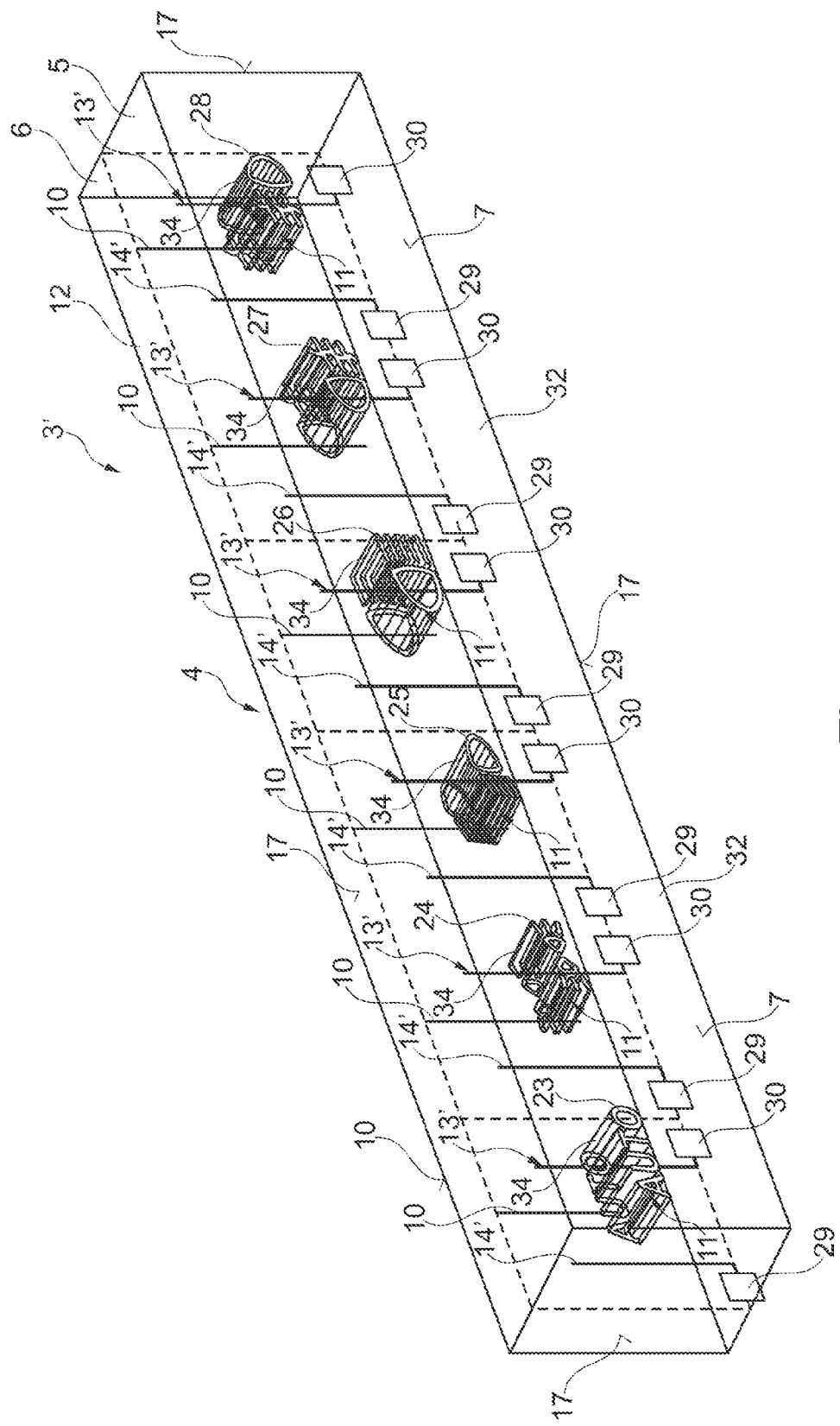
FIG. 7 shows a schematic perspective view of a plastic body of the display switch unit according to FIG. 3.

FIG. 7 shows a schematic perspective view of a plastic body 4' of the display switch unit 3' in which it is again clear that the plastic switch symbols 11 are disposed three-dimensionally in a front plastic region 5, which can be achieved, for example, by means of a doping process of the transparent plastic with the aid of light-sensitive nanoparticles and can be achieved by forming or casting corresponding three-dimensional plastic switch symbols 23 to 28 from a plastic compound 34 containing these light-sensitive particles.

The prefabricated plastic switch symbols 11 can then be potted or inserted into the transparent plastic compound 32 of the front plastic region 5. Instead of potting, these plastic switch symbols can also be inserted or glued into prepared recesses in the front plastic region 5. A transparent adhesive is again used when gluing in. The electrical connections 15 and 16 of this sensor structure 14' are again provided on the connection regions for each individual plastic switch symbol 11.

Figure 8:
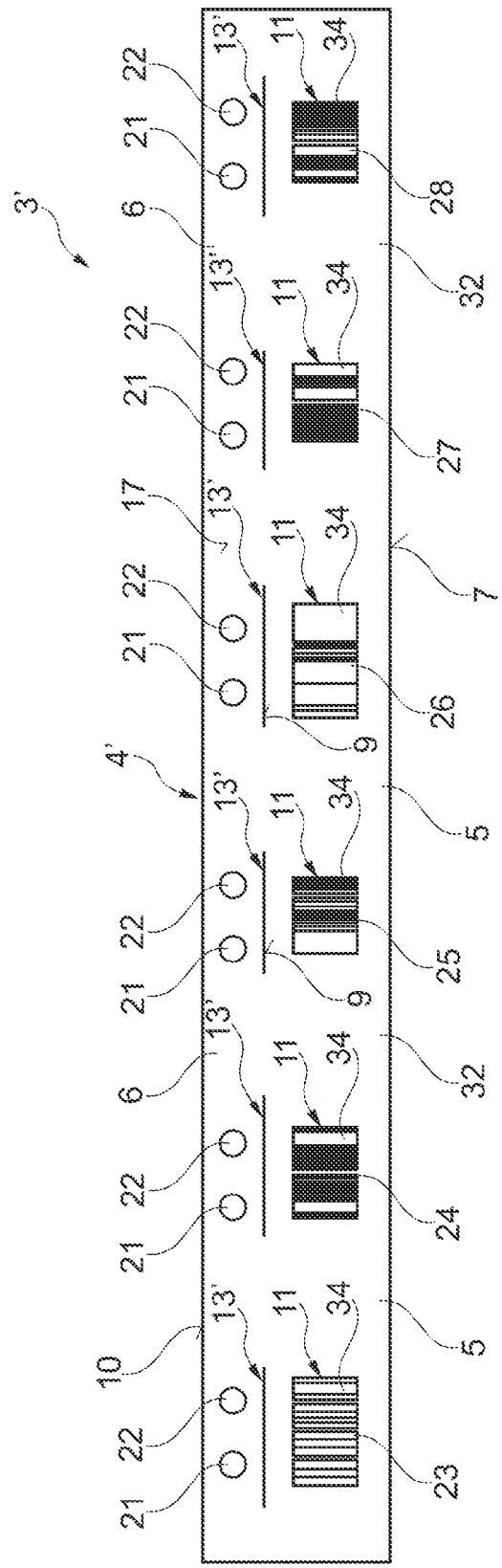
FIG. 8 shows a schematic view from below of a plastic body with light-emitting diode positions.

FIG. 8 shows a schematic view from below of a plastic body 4' for a display switch unit 3' with the positions for two light-emitting diodes 21 and 22 each, which illuminate the transparent undoped plastic compound 32 surrounding the plastic switch symbols 11 indirectly and in color. The switching state for each individual one of the switches of the plastic switch symbols 23 to 28 of the display switch unit 3' can thus be symbolized with different display colors. For this purpose, the light-emitting diodes are arranged in pairs so that a total of three switching states can be shown, on the one hand the ready state, which makes the switch symbols light up by means of a corresponding backlight, and the switch-on state and switch-off state of each individual symbol, by indirectly illuminating the surrounding transparent plastic compound 32 by suitably colored illuminating light-emitting diodes 21 or 22.

Figure 9:
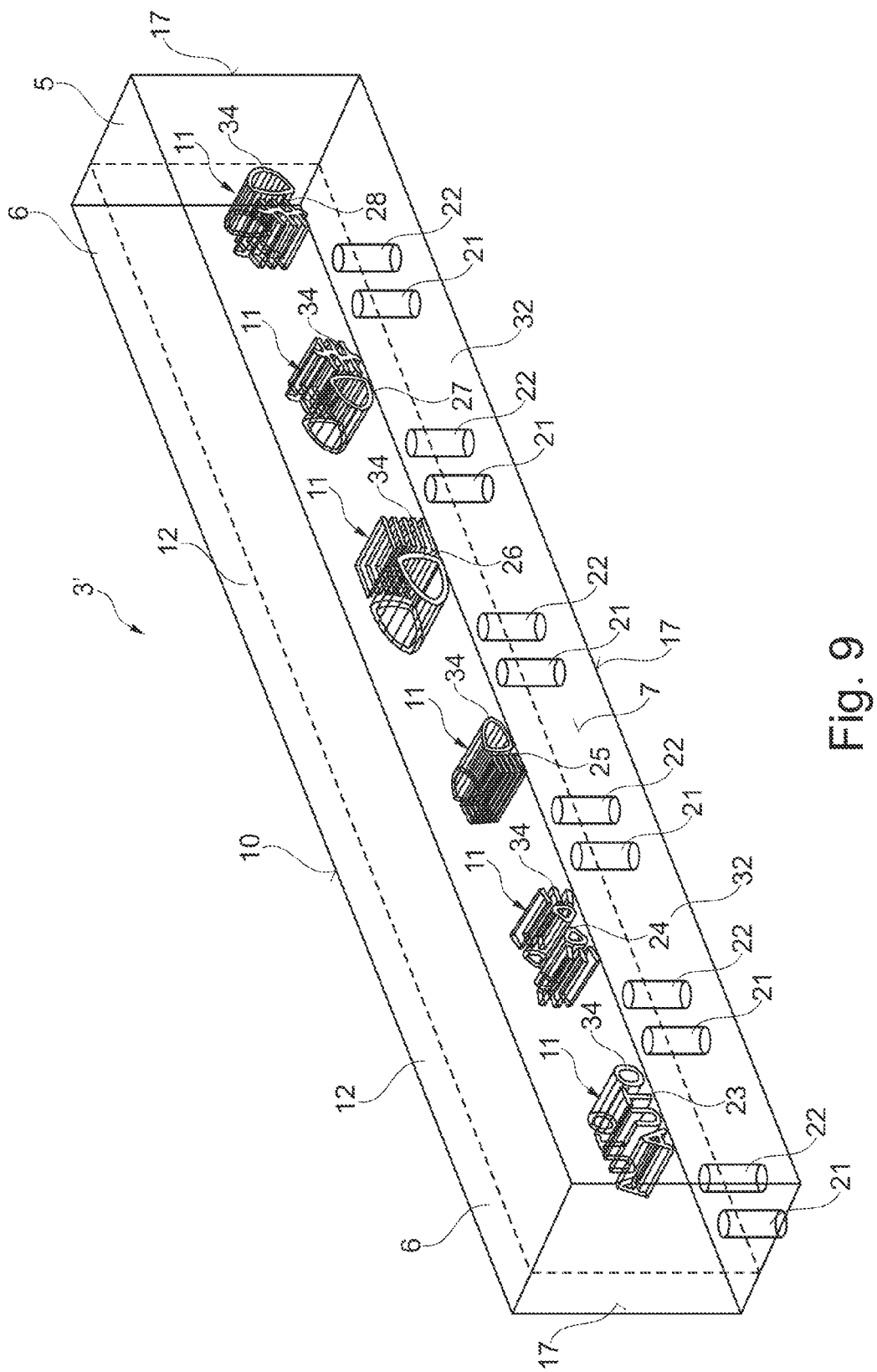
FIG. 9 shows a schematic perspective view of the plastic body according to FIG. 8.

FIG. 9 shows a schematic perspective view of the plastic body 4' according to FIG. 8. In this embodiment the light-emitting diodes 21 and 22 are disposed on the lower edge side 17 in the rear plastic region 6 and thus indirectly illuminate the transparent plastic of the front plastic region 5 and bathe this transparent plastic compound 32 in a colored light, which signals the switched-on state of the switch symbols 23 to 28.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A display switch unit for a vehicle comprising:
 a plastic body comprising:
  a transparent front plastic region; and
  a rear plastic region;
 a plurality of plastic switch symbols disposed in the transparent front plastic region of the plastic body; and
 a plurality of proximity sensors with a sensor structure disposed behind one of the plurality of plastic switch symbols in the rear plastic region,
 wherein a material of the plurality of plastic switch symbols comprises light-sensitive invisible particles,
 wherein the light-sensitive invisible particles are disposed in such a manner that under irradiation a plurality of colored illuminated switch symbols are visible in a surrounding transparent front plastic region.

2. The display switch unit according to claim 1, wherein the sensor structure comprises a plurality of invisible electrically conducting layer structures and connected to electrical connections on one edge side of the plastic body including a plurality of regions.

3. The display switch unit according to claim 1, wherein the sensor structure comprises a capacitor structure.

4. The display switch unit according to claim 1, further comprising a backlight adapted to day operation and night operation.

5. The display switch unit according to claim 1, wherein each of the plurality of plastic switch symbols comprises different switch position display colors and light-emitting diodes for the different switch position display colors that are disposed on edge sides of the plastic body.

6. The display switch unit according to claim 1,
 wherein the plurality of plastic switch symbols are arranged three-dimensionally in a transparent plastic volume of the transparent front plastic region, and
 wherein the plurality of plastic switch symbols comprises a pre-formed colored illuminating plastic and is clad in a transparent plastic compound.

7. The display switch unit according to claim 1, further comprising a plurality of light-sensitive nanoparticles that are disposed in a pre-formed colored illuminating plastic that is configured to light up in color.

8. The display switch unit according to claim 1, wherein the sensor structure is a strip structure made at least partially from a transparent electrically conducting structured oxide coating.

9. The display switch unit according to claim 1, wherein the sensor structure is a meander structure made at least partially from a transparent electrically conducting structured oxide coating.

10. The display switch unit according to claim 1, wherein the sensor structure comprises a direction identification so that operating functions such as changes in seat heating, ventilation, temperature, air conditioning settings are individually adjustable for a driver and a passenger side.

11. The display switch unit according to claim 1, further comprising a circuit boards with electronics for the sensor structure that are disposed as a nontransparent additional layer on the rear side of a transparent plastic body.

12. A method for producing a display switch unit for a vehicle, comprising:

producing dimensionally stable three-dimensional transparent plastic switch symbols at least partially from a plastic compound that is configured to light up upon excitation;

embedding the dimensionally stable three-dimensional transparent plastic switch symbols in a transparent front plastic region made of a transparent plastic compound;

applying a transparent electrically conducting coating to a rear side of the transparent front plastic region;

structuring the coating to form a sensor structure of a proximity sensor; and applying a rear plastic region congruent to the transparent front plastic region.

13. The method according to claim 12, wherein the embedding is conducted under an approximate vacuum.

14. The method according to claim 12, wherein the embedding comprises gluing the dimensionally stable three-dimensional transparent plastic switch symbols into prepared recesses of the transparent front plastic region.

15. The method according to claim 12, wherein the applying and the structuring comprises spraying and selective etching to form the sensor structure.

16. The method according to claim 12, wherein the applying and the structuring comprises vapor deposition and subsequent selective etching to form the sensor structure.

17. The method according to claim 12, wherein the applying and the structuring comprises PVD and subsequent selective etching to form the sensor structure.

18. The method according to claim 12, wherein the applying and the structuring comprises CDV and subsequent selective etching to form the sensor structure.

19. The method according to claim 12, further comprising casting a rear plastic region onto the transparent front plastic region by embedding the sensor structure to produce a plastic body.

* * * * *